(12) United States Patent
Hubbard et al.

(10) Patent No.: US 6,889,162 B1
(45) Date of Patent: May 3, 2005

(54) WAFER TARGET DESIGN AND METHOD FOR DETERMINING CENTROID OF WAFER TARGET

(75) Inventors: Bryan Hubbard, Garland, TX (US); Pierre Leroux, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/520,686

(22) Filed: Mar. 7, 2000

(51) Int. Cl.$^7$ ................................. G01B 11/00
(52) U.S. Cl. ................. 702/155; 702/159; 356/625
(58) Field of Search ............... 702/155, 90, 94, 702/95, 150, 152, 157–159, 169, 166, 170, 172, 189; 356/401, 625, 630, 634–636, 614, 620, 601, 399, 400, 445, 908; 382/151, 144, 145; 257/797; 348/87; 700/119–121; 438/14, 16, 7; 250/559.19, 599.22, 559.24, 559.26, 559.27, 559.29, 559.3

(56) References Cited

U.S. PATENT DOCUMENTS

| | | | |
|---|---|---|---|
| 4,253,112 A | 2/1981 | Doemens | 358/101 |
| 4,880,309 A | 11/1989 | Wanta | 356/401 |
| 5,545,593 A * | 8/1996 | Watkins et al. | 438/16 |
| 5,760,484 A | 6/1998 | Lee et al. | 257/797 |
| 5,877,505 A * | 3/1999 | Fujino | 250/491.1 |
| 6,043,133 A * | 3/2000 | Jang et al. | 438/401 |
| 6,097,495 A * | 8/2000 | Uzawa et al. | 356/401 |
| 6,281,027 B1 * | 8/2001 | Wei et al. | 438/14 |

FOREIGN PATENT DOCUMENTS

JP 05-013306 * 1/1993

OTHER PUBLICATIONS

Translation of JP 05–013306, Jan. 1993.*
Patent Abstracts of Japan, vol. 017, No. 272 (E–1371), May 26, 1993–& JP 05 013306 A (Fujitsu Ltd) Jan. 22, 1993 abstract; figures.

* cited by examiner

*Primary Examiner*—Hal Wachsman
(74) *Attorney, Agent, or Firm*—Peter Zawilski

(57) ABSTRACT

A method for determining the centroid of a wafer target. In one embodiment, the method comprises a series of steps in a stepper, starting with the step of receiving a wafer, having a target set formed therein. Next, a signal is passed over the target set and over a material separating target shapes in the target set. Then a return signal is reflected, and received, from the surface of the target shapes and the material separating them. A location of at least one maxima point of the return signal is identified. Finally, a centroid is determined as the median of the locations of at least one maxima point.

14 Claims, 12 Drawing Sheets

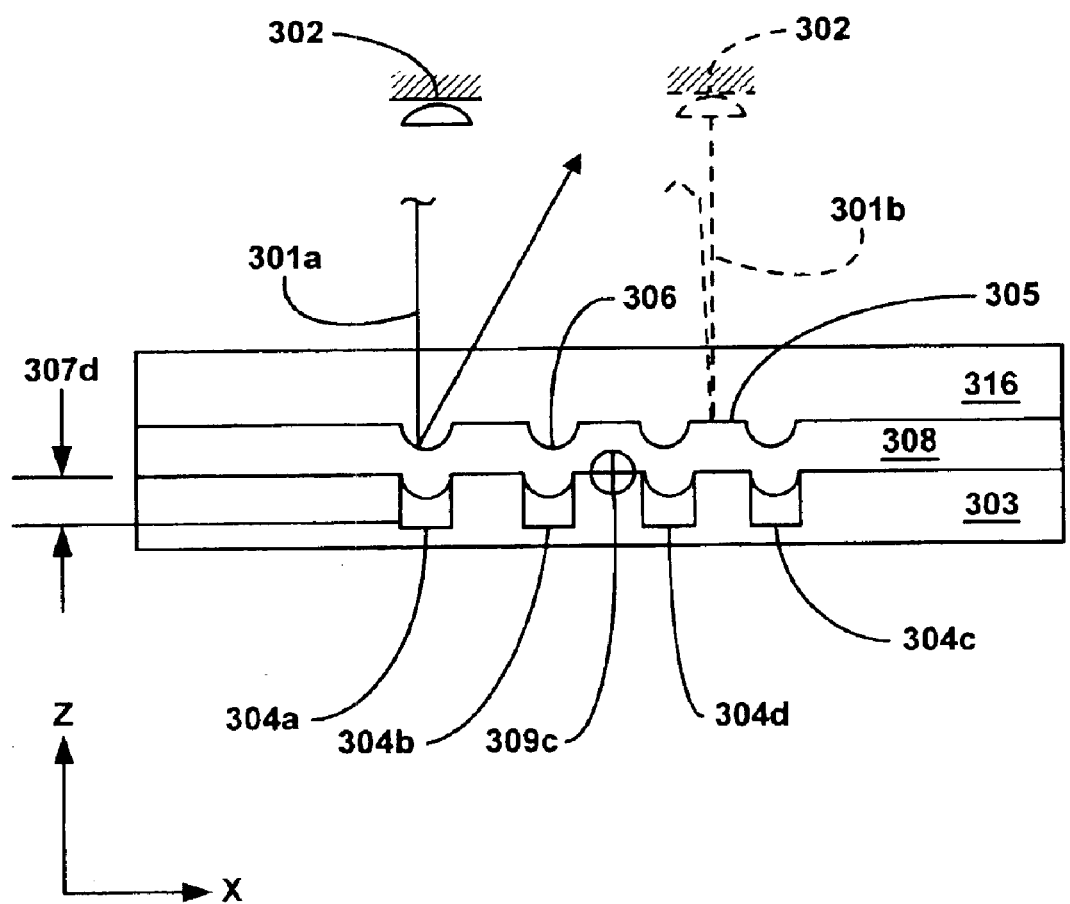
FIG. 3B VIEW A-A

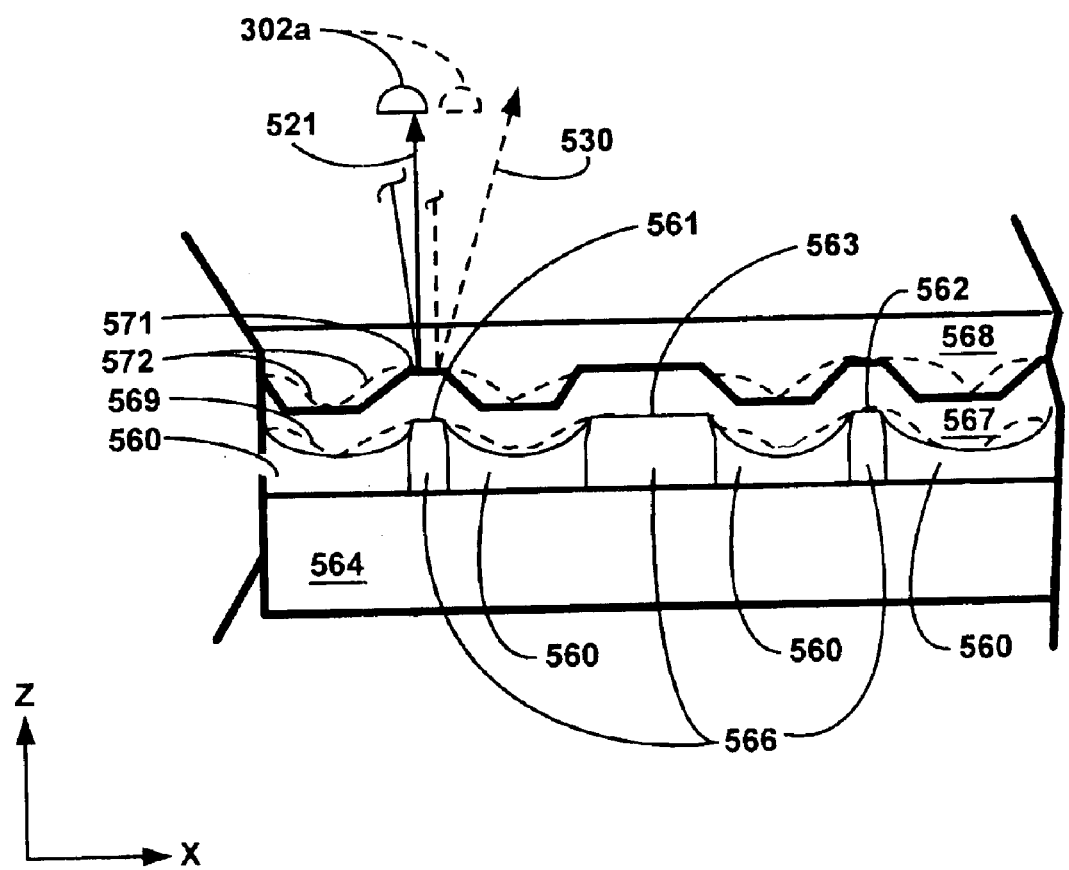
FIG. 5D View B-B

WAFER TARGET DESIGN AND METHOD FOR DETERMINING CENTROID OF WAFER TARGET

TECHNICAL FIELD

The present claimed invention relates to the field of semiconductor wafer fabrication. More specifically, the present claimed invention relates to a target design used for aligning a wafer, and a method for determining a centroid of a target.

BACKGROUND ART

Integrated circuits (ICs) are fabricated en masse on silicon wafers using well-known photolithography, etching, deposition, and polishing techniques. These techniques are used to define the size and shape of components and interconnects within a given layer of material deposited on a wafer. The IC is essentially built-up using a multitude of interconnecting layers, one formed on top of another. Because the layers interconnect, a need arises for ensuring that the patterns on adjacent layers of the wafer are accurately formed. Conventional methods rely heavily on accurate alignment of the wafer, using targets, to ensure accurate formation of circuit patterns on the wafer.

Referring now to prior art FIG. 1A, a detail view of a conventional alignment target, formed in a wafer 100a is shown. Alignment target 104 is shown in a cross-section view of a wafer, with its length running perpendicular to the X-Z plane shown, to form a rectangular bar shape. Layer of oxide 106 is located above a substrate 102. A trench in layer of oxide 106 is filled with a material, e.g. tungsten, to form target 104. The tungsten material is polished down, using Chemical Mechanical Polishing (CMP) methods and apparatus, to leave just the tungsten material in the trench to act as target 104.

Due to the mechanical nature of the CMP method, apparatus and materials, the top surface 112 of target 104 can have residue buildup 110a in a corner of trench 104. The direction of pad rotation for the CMP operation is shown by direction arrow 111. Frequently, the residue buildup 110a cannot be removed from the trench 104. Hence, it becomes trapped under the subsequent layer of material 108, typically metal, deposited onto the wafer. A photoresist layer 116 is deposited on top of layer 108. A pattern is typically exposed on the photoresist layer 116.

However, to locate the pattern accurately, the target location is acquired by reading a reflected signal from the edges 114a and 114b formed by the concave surface 112 of the trench 104 in the wafer 100a. Unfortunately, the trapped residue 110a frequently creates an irregular surface 114a in the subsequent layer of material 108 deposited on it in an area proximate to the trapped residue 110a. The surface irregularity 114a subsequently skews the signal, reflected from the surface of layer 108, used to detect the center of the target. The skewed signal consequently misrepresents the actual location of the target on the wafer, thus mislocating subsequently created patterns, e.g. ICs, formed on the wafer. This mislocation can cause poor wafer yield or can cause subsequent product failures. Consequently, a need arises for an apparatus and a method that will accurately locate the target on a wafer regardless of the flatness of the target surface.

A recent development in conventional CMP operations is a change from ferrous nitrate material to potassium iodate material for the abrasive slurry. However, potassium iodate does not possess some of the benefits of ferrous nitrate. That is, while potassium iodate leaves less residue on the target, it actually makes corners 110a and 110b of target 104 more asymmetric. Consequently, when using potassium iodate the asymmetry of surface 112, edges 11oa and 110b, and edges 114a and 114b, would be worse than those created using ferrous nitrate polishing material.

Referring now to prior art FIG. 1B, a graph showing a conventional return signal with a conventional minima used to determine a centroid of a wafer target is shown. Graph 100d has an ordinate of intensity of returned signal 120 and a location 122 of the wafer or target from where the signal is received. Specifically, area 134 of return signal 124 is associated with a return signal that was reflected from surface 112 and corners 114a and 114b of metal layer 108 above target 104 in wafer 100a. Area 135 arises from a duplicate target formed in wafer, e.g. an unshown target that would be parallel to target 104 in prior art FIG. 1A. Conventionally, a minima of the target is determined by a slope of the signal arising from non-flat surface and corners 114a and 114b of metal layer 108 above target 104, as shown in prior art FIG. 1A. However, slope 1 141 and slope 2 142 of return signal 124 are not symmetrical in prior art FIG. 1B. This is due to the fact that reflected signal 124 from one edge, e.g. edge 114a, is different than the reflected signal from another edge, e.g. edge 114b, of the surface of the layer of material 108 located above target 104. This unsymmetrical signal is due to the asymmetry between edges 114a and 114b, and due to the roughness of edge 114a. Again, this asymmetry is exacerbated by the new potassium iodate material used in the CMP process.

As a result of the poor quality of the return signal 124 from two targets, the location of the center of the individual targets, e.g. as determined by minima 1 (MIN 1) 131 and minima 2 (MIN 2) 132 is inaccurate. Consequently, the centroid 108 of the target pattern, determined by location of the centers of the individual targets, is frequently mislocated. Given the close tolerances of conventional and future Integrated Circuit (IC) designs, the mislocation of the target is unacceptable. Consequently, a need arises for an apparatus and a method that will accurately locate the target on a wafer regardless of the asymmetry of the target surface.

The width 113a of the target 104 formed in layer 106 using conventional methods and apparatus effectively becomes narrower on subsequent layer of material. Thus, in layer 108, a width 113b of target is actually narrower than the original width 113a. For example, if width 113a is 4 microns ($\mu$) then width 113 would be on the order of approximately $2\mu$. With a target this small, conventional stepper apparatus and software is frequently unable to even acquire the target. If the target cannot be acquired, then further processing steps may not be feasible, because the stepper is essentially blind to the position of the wafer. Thus, the wafer becomes useless and is typically scrapped. Consequently, a need arises for a method and apparatus with increased target acquisition rate, using either a conventional or a modified target.

Because the conventional targets are designed to have relatively long and straight edges, the CMP operation can significantly affect the symmetry and shape of the edges of the target. Additionally, because the conventional location method depends upon the reflected signal from the edges of the target, it is substantially dependent upon the condition of the edges of the target. Consequently, a need arises for a target design that is immune from the asymmetry and non-flat surfaces likely to arise in conventional CMP processes.

In summary, a need arises for ensuring that patterns on adjacent layers of the wafer are accurately formed. To satisfy this need, a need arises for an apparatus and a method that will accurately locate a target on a wafer regardless of the flatness of the target surface. Additionally, a need arises for an apparatus and a method that will accurately locate the target on a wafer regardless of the asymmetry of the target surface. Another need arises for a method and apparatus with an increased target acquisition rate, using either a conventional or a modified target. Lastly, a need arises for a target design that is immune from the asymmetry and non-flat surfaces likely to arise in conventional CMP processes.

DISCLOSURE OF THE INVENTION

The present invention ensures accurate formation of patterns on adjacent layers of the wafer by providing accurate target location. Additionally, the present invention provides an apparatus and a method that will accurately locate a target on a wafer regardless of the flatness of the target surface. Furthermore, the present invention provides an apparatus and a method that will accurately locate the target on a wafer regardless of the asymmetry of the target surface. The proposed apparatus and method has an increased target acquisition rate, using either a conventional or a modified target. Finally, the present invention provides a target design immune from the asymmetry and non-flat surfaces likely to arise in conventional CMP processes.

In one embodiment, the present invention provides a method for determining the centroid of a wafer target. In one embodiment, the method comprises a series of steps in a stepper, starting with the step of receiving a wafer having a target set formed therein. Next, a signal is passed over the target shapes and over a material separating target shapes within the target set. The signal is reflected from the surface of the target shapes and from the material separating the targets, and is subsequently detected by a sensor. A location of at least one maxima point of the return signal is identified. The maxima corresponds to a return signal reflected off of the material that separates the target shapes of the target set. Finally, a centroid is calculated as the median of the locations of the maxima points of the reflected signal from the material area separating the targets. Because the present embodiment utilizes the maxima of the return signal from a material separating the targets, it avoids problems with the target edges that identify the return signal minima from the target surface, used by the prior art. This embodiment is implemented by programming a stepper to read two virtual rectangle targets. The two virtual rectangle targets are implemented by instructing the stepper to read the four conventional rectangle targets as the side walls of the two virtual rectangle targets. Thus, where conventional methods would not be able to acquire independent targets, the present invention increases target acquisition rate, using either a conventional or a modified target, by effectively constructing larger virtual targets from the smaller actual targets.

In another embodiment, the present invention recites a target pattern that is immune from the asymmetry and non-flat surfaces arising in conventional targets generated by conventional CMP operations. In particular, one embodiment of the present invention is a target pattern having a solid spine extending in one direction, and a plurality of fingers coupled to the solid spine extending perpendicular to a lengthwise axis of the spine. Alternatively, the fingers can independently or dependently extend at different angles from the axis of said solid spine. The fingers have a gap between each other. Surrounding the target pattern is a background of appropriate gray scale shade. In one direction, the target pattern is a solid shade, e.g. opaque, while the background is another gray scale shade, e.g. transparent. The spine of the present embodiment provides a strong return signal representing the centroid of the target pattern, while the narrow and unconnected ends of the fingers provide edges that are immune from asymmetry and non-flatness arising from a conventional CMP processes.

These and other objects and advantages of the present invention will no doubt become obvious to those of ordinary skill in the art after having read the following detailed description of the preferred embodiments illustrated in the various drawing figures.

BRIEF DESCRIPTION OF THE DRAWINGS

The accompanying drawings, which are incorporated in, and form part of, this specification, illustrate embodiments of the invention and, together with the description, serve to explain the principles of the invention. The drawings referred to in this description should be understood as not being drawn to scale except as specifically noted.

PRIOR ART

PRIOR ART

FIG. 3B is the wafer of FIG. 3A, in a cross-sectional view, in accordance with one embodiment of the present invention.

FIG. 5D is the wafer of FIG. 5C, in a cross-sectional view, in accordance with one embodiment of the present invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention can be practiced without these specific details. In other instances, well-known methods, procedures, components, and materials have not been described in detail so as not to unnecessarily obscure aspects of the present invention.

Some portions of the detailed descriptions which follow, e.g. the processes, are presented in terms of procedures, logic blocks, processing, and other symbolic representations of operations for fabricating patterned layers, e.g. ICs, on a wafer. These descriptions and representations are the means used by those skilled in the art of wafer fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of applying material, removing material, or changing the state or structure of a material on a wafer by chemical, optical, and mechanical means.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, terms such as or "receiving," "passing," "identifying," "determining," or the like, refer to the action and processes of fabricating material and patterns on a wafer from a reticle.

Figure 2:
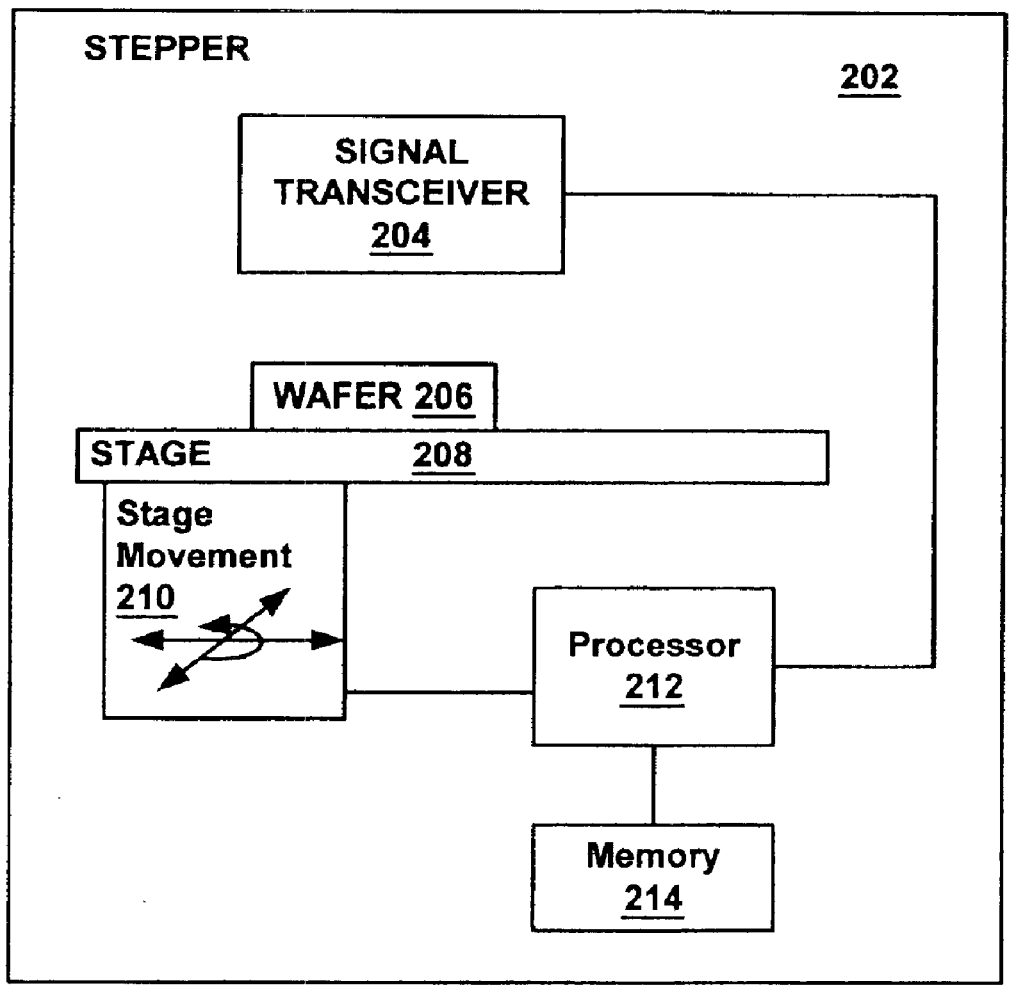
FIG. 2 is a block diagram of a stepper adapted to locate the centroid of a target in a wafer, in accordance with one embodiment of the present invention.

Referring now to FIG. 2, a block diagram of a stepper adapted to align a wafer with a target is shown, in accordance with one embodiment of the present invention. Stepper 202 includes a stage 208 coupled to a stage movement device 210, a processor 212, a signal transceiver 204, and a memory 214. Wafer 206 is placed on stage 208 for processing in stepper 202. Memory 214 contains program instructions that, when implemented through processor 212, allow stepper 202 to implement the steps used in the present invention to determine the centroid of a target on a wafer. Flowchart 4000, presented hereinafter, provides one embodiment of these steps.

Memory 214 for the present embodiment can either be permanent, such as read only memory (ROM), or temporary memory such as random access memory (RAM). Memory 214 can also be any other type of memory storage, capable of containing program instructions, such as a hard drive, a CD ROM, or flash memory. Furthermore, processor 212 can either be an existing system processor or microprocessor, a dedicated digital signal processing (DSP) processor unit, or a dedicated controller or microcontroller. Alternatively, the instructions may be implemented using an implementation of a state machine.

Signal transceiver 204 is coupled to processor 212. Signal transceiver 204 is a source of an electromagnetic signal, such as a laser. Additionally, signal transceiver 204 is a receiver for an electromagnetic signal, such as the return signal that is reflected from a wafer. In this manner, the signal transceiver 204 can be utilized, as described in flowchart 4000 as one embodiment, to satisfy the steps of the present invention. Signal transceiver 204 can be any one of many well-known transceiver configurations.

Figure 3A:
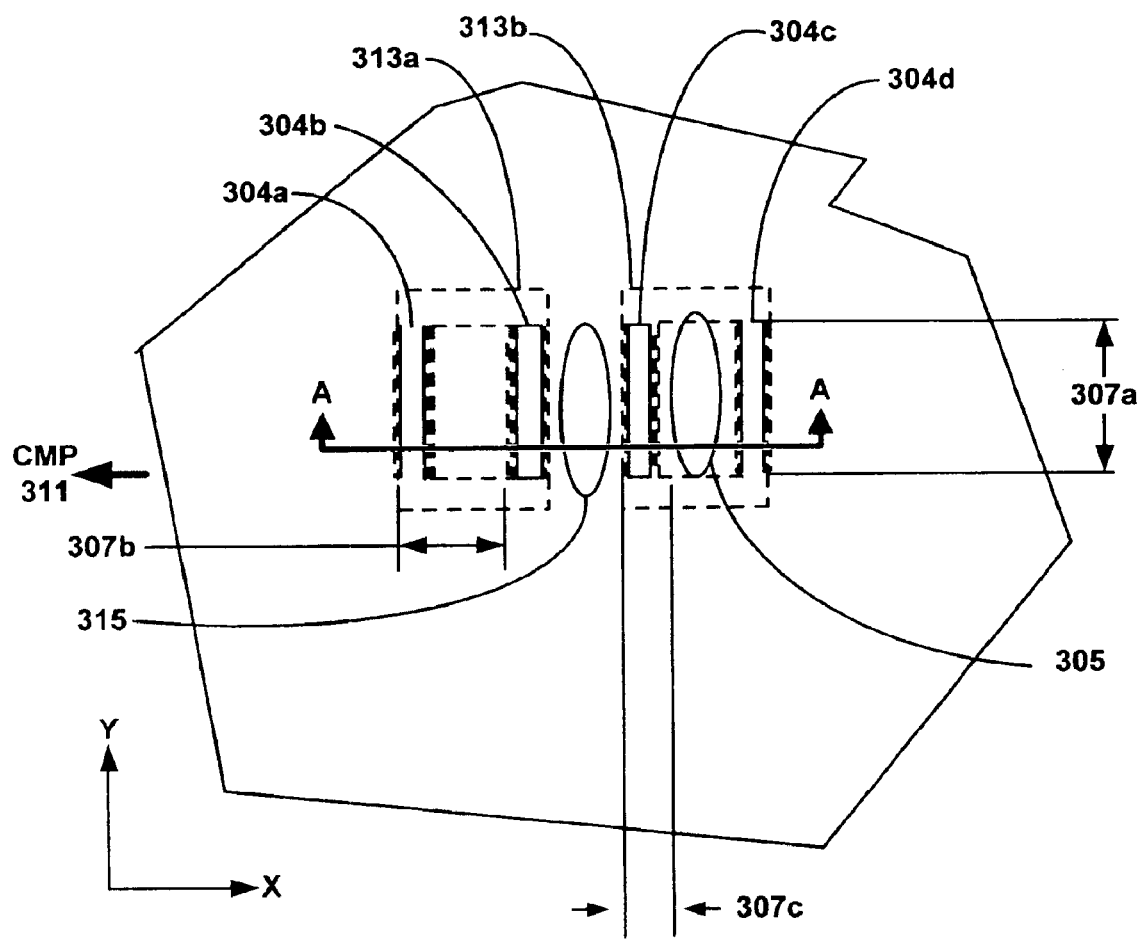
FIG. 3A is a wafer with an alignment target formed therein, in accordance with one embodiment of the present invention.

Referring now to FIG. 3A, a portion of a wafer 300 with an alignment target formed therein is shown, in accordance with one embodiment of the present invention. FIG. 3A shows a top view of wafer 300 located in an X-Y plane. Wafer 300 has four alignment targets 304$a$, 304$b$, 304$c$, and 304$d$, in the present embodiment. Alignment targets 304$a$–304$d$ can be grouped into two sets to form larger virtual targets, in one embodiment. For example, targets 304$a$+304$b$ can be grouped together to create a virtual target 313$a$. Similarly, targets 304$c$+304$d$ can be grouped together to create a virtual target 313$b$. Virtual target 313$a$ uses the conventional smaller targets 304$a$ and 304$b$ to define the sides of the larger virtual rectangle. Thus, while the larger virtual rectangle, e.g. 313$a$, does not really exist, because it does not have a top and bottom as shown in dashed lines, it does have side walls that can be evaluated by the stepper. Virtual targets 313$a$ and 313$b$ are separated by land of material 315. Beneficially, this method can use either conventional or modified targets with which to create the larger virtual targets.

Targets, or target shapes, 304$a$–304$d$ are rectangular in shape, having a height 307$a$ of approximately 30 microns ($\mu$), a width 307$c$ of approximately 4$\mu$, and a pitch 307$b$ of approximately 20$\mu$. Targets 304$a$–304$d$ are separated by pitch distance 307$b$ of material referred to as a "land" of material. One such land 305 shown between targets 304$c$ and 304$d$. The present invention arranges targets sequentially in the X-direction, to determine a centroid in the X-direction. A direction of CMP operation is indicated by arrow 311.

The present invention is well-suited to alternatives from the embodiment shown in FIG. 3A. For example, while the present embodiment utilizes a specific shape of targets, quantity of targets, and grouping of targets to create a specific quantity of larger virtual targets, the present invention is well suited to many alternatives. Also, the present invention can have targets with many different sizes, configurations and orientations. Furthermore, the present invention is well-suited to arranging targets in alternative directions to determine a centroid in the alternative directions, e.g. the Y-direction. Additionally, the present invention is suitable to using any quantity of sets of targets with any quantity of target shapes within the target set. In one embodiment, additional sets of targets are used to provide multiple data points that can be averaged to determine the final centroid. The averaging is utilized to remove noise arising from the target formation and the centroid determining process.

The present invention is well-suited to placing targets 304$a$–304$d$ in silicon substrate, an oxide layer, or some other layer of material on the wafer.

Target shapes 304$a$–304$d$ can be either separate entities, or they can be joined together, e.g. at one or both ends, so long as a land of material different from the target material, exists between the targets. The land of material between targets, e.g. 304$a$–304$d$, can be any material that will provide a return signal that can be distinguished form the return signal from the target surface.

Referring now to FIG. 3B, a different view of wafer 300 with the alignment target of FIG. 3A is shown, in accordance with one embodiment of the present invention. Specifically, FIG. 3B shows a cross-sectional view taken along line A—A of FIG. 3A. Centroid 309c represents the centroid of targets 304a–304d. Targets 304a–304d have a depth 307d in layer 303, made of silicon dioxide in one embodiment. However, the present invention is well-suited to targets having any depth in a layer of any type material. Layer 308 of metal material, existing above targets 304a–304d, conforms to the surface of targets 304a–304d and layer 303. Thus, flat portions of layer 308 exist above flat portions of layer 303, such as the flat land area 305 above a flat portion of layer 303. Similarly, a concave surface of layer 308 exists above the concave surface of targets, such as the concave surface 306 located proximately above target 304b. A layer of photoresist material 316, which does not conform to surface irregularities, is deposited above layer 308. Two instances of a light source used to evaluate the surface of layer 316 is shown as light source 301a and 301b. The reflection from light source 301a and 301b off of layer 316 of wafer 300 is detected by detector 302.

Figure 3C:
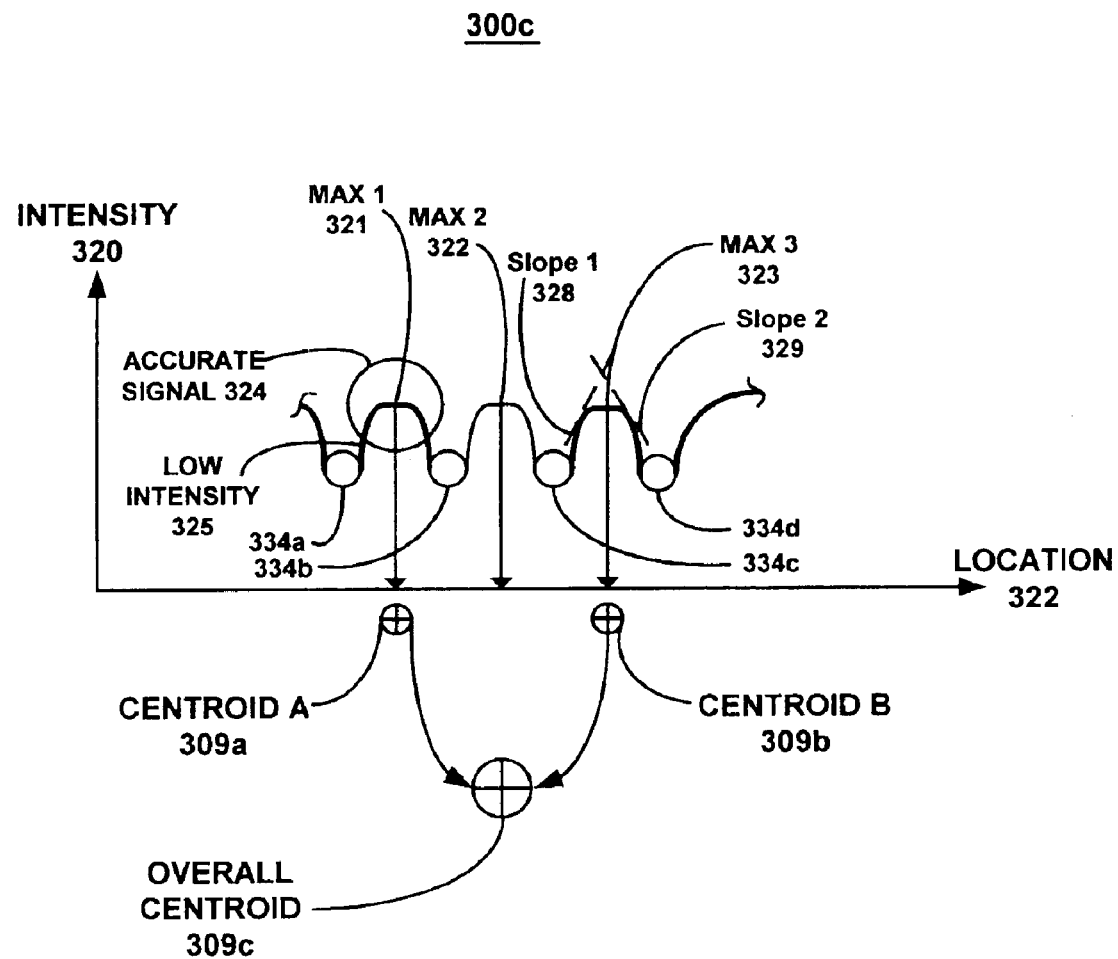
FIG. 3C is a graph showing a signal with a maxima used to determine a centroid of a target, in accordance with one embodiment of the present invention.

Referring now to FIG. 3C, a graph 300c showing a signal with an extrema used to determine a centroid of a target, or a target set, is shown in accordance with one embodiment of the present invention. Graph 300c of FIG. 3C has an ordinate axis of intensity 320 and an abscissa axis of location on a wafer 322. Return signal 324, shown in FIG. 3C, represents the portion of return signal reflected from a flat portion of material separating concave portions of layer over targets. Signals reflected from concave portions of layer over targets is shown by cross-hatched areas 334a–334d in FIG. 3C, which correspond to targets 304a–304d of FIG. 3A. This material area is shown in FIG. 3B as portions of material layer 308 in wafer 300 separating targets 304a–304d, e.g. land 305. The material 308 can be a variety of materials or layers as described in FIG. 3B. In the present embodiment, the extrema is a maxima. That is, maxima 1 321, maxima 2 322, and maxima 3 323 represent a maximum Intensity of return signal 324. As an example, maxima 3 323 signal represents the reflected signal 301b from top surface 305 of layer 308 that corresponds to the land of material separating targets 304c and 304d in a submerged layer.

Still referring to FIG. 3C, a maxima is defined as a point where a slope of zero exists, where slope polarity changes sign, e.g. between a positive slope and a negative slope, and where a positive slope exists on the left side of the maxima. As an example, slope 1 328 and slope 2 329 are opposite polarity slopes on either side of maxima 3 323. The same slope scenario exists for maxima 1 321 and maxima 2 322. A centroid is a center of mass, or a geometric center, of 1 or more targets. For example, centroid A 309a represents maxima 1 321 as the centroid of virtual rectangle target 313a. Similarly, centroid B 309b represents maxima 3 323 as the centroid of virtual rectangle target 313b. Centroid 309c represents a median centroid for all targets, e.g. the centroid between virtual targets 313a and 313b.

Figure 1A:
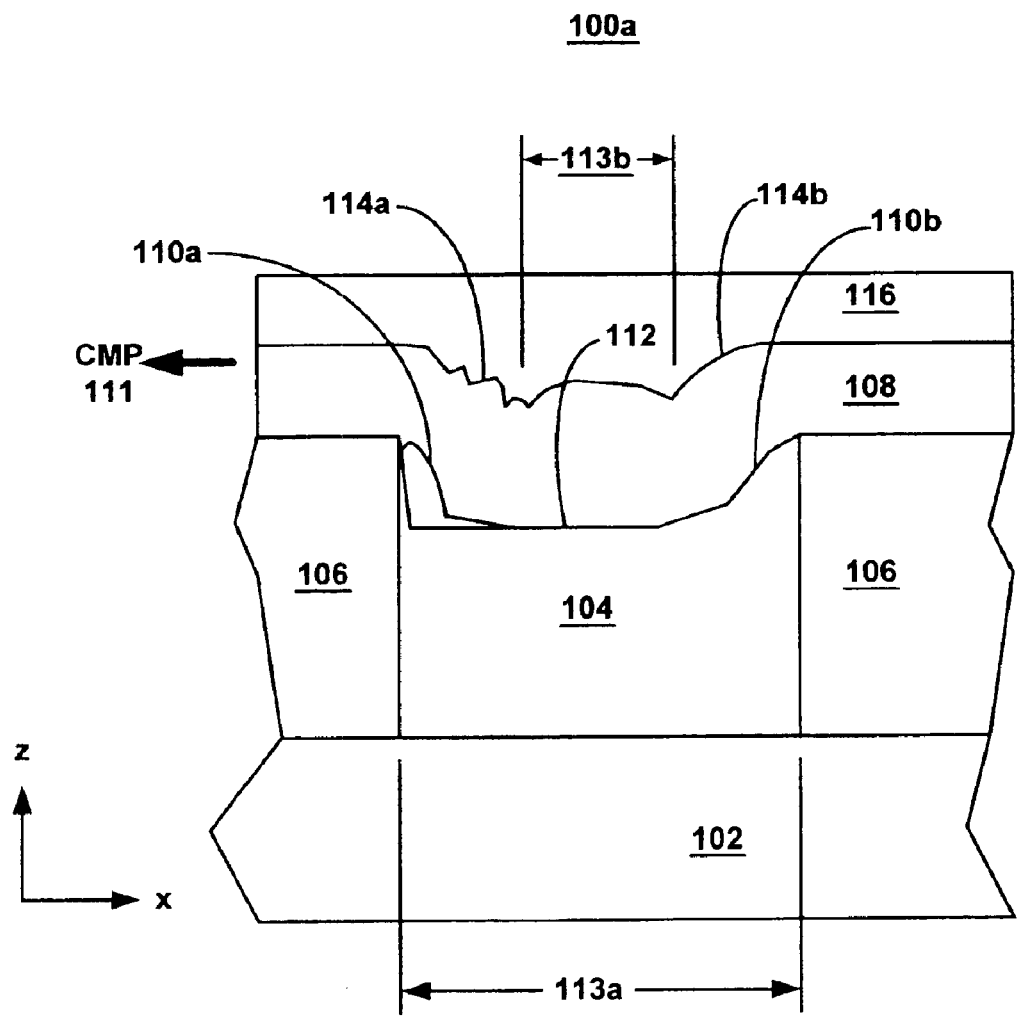
FIG. 1A is a detail view of a conventional alignment target, formed in a wafer.
Figure 1B:
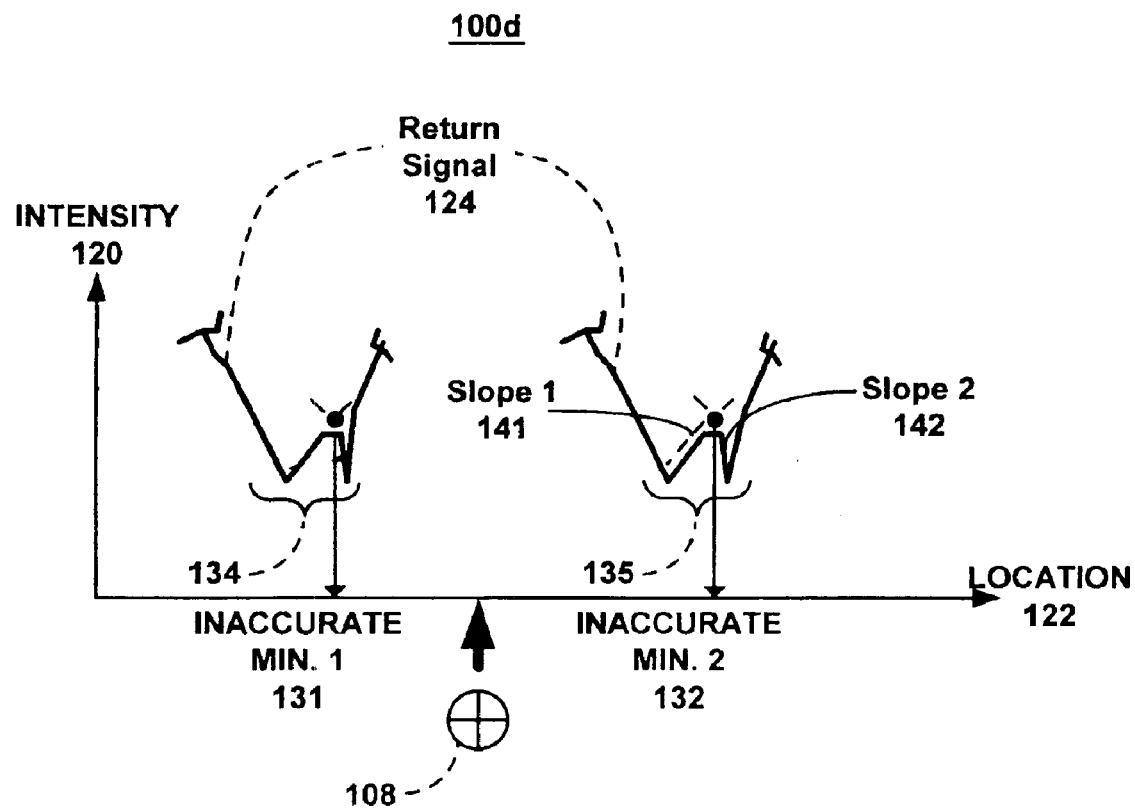
FIG. 1B is a graph showing a conventional return signal with a conventional minima used to determine a centroid of a wafer target.

The present invention avoids the problems associated with the conventional method using return signals from target surface, represented by cross-hatch areas 334a–334d in FIG. 3C and represented by areas 134 and 135 in prior art FIG. 1B. The present invention accomplishes its more accurate centroid calculation by using return signal from material areas, with better flatness and symmetry properties, that separate the targets. An example of the material areas responsible for max 3 323 is the flat land 305 area shown in FIG. 3B, where light signal 301b is reflected with nearly a zero angle of reflection, and thus provides a high intensity reading from detector 302.

The embodiment of the present invention shown in FIG. 3C is suitable to several alternatives. For example, the slopes and shape of return signal 324 are exemplary, and can have alternative features in another embodiment. Furthermore, the spacing of maxima is dependent upon the location of targets, and thus, will be different for alternative target shapes, sizes, and locations.

Figure 4:
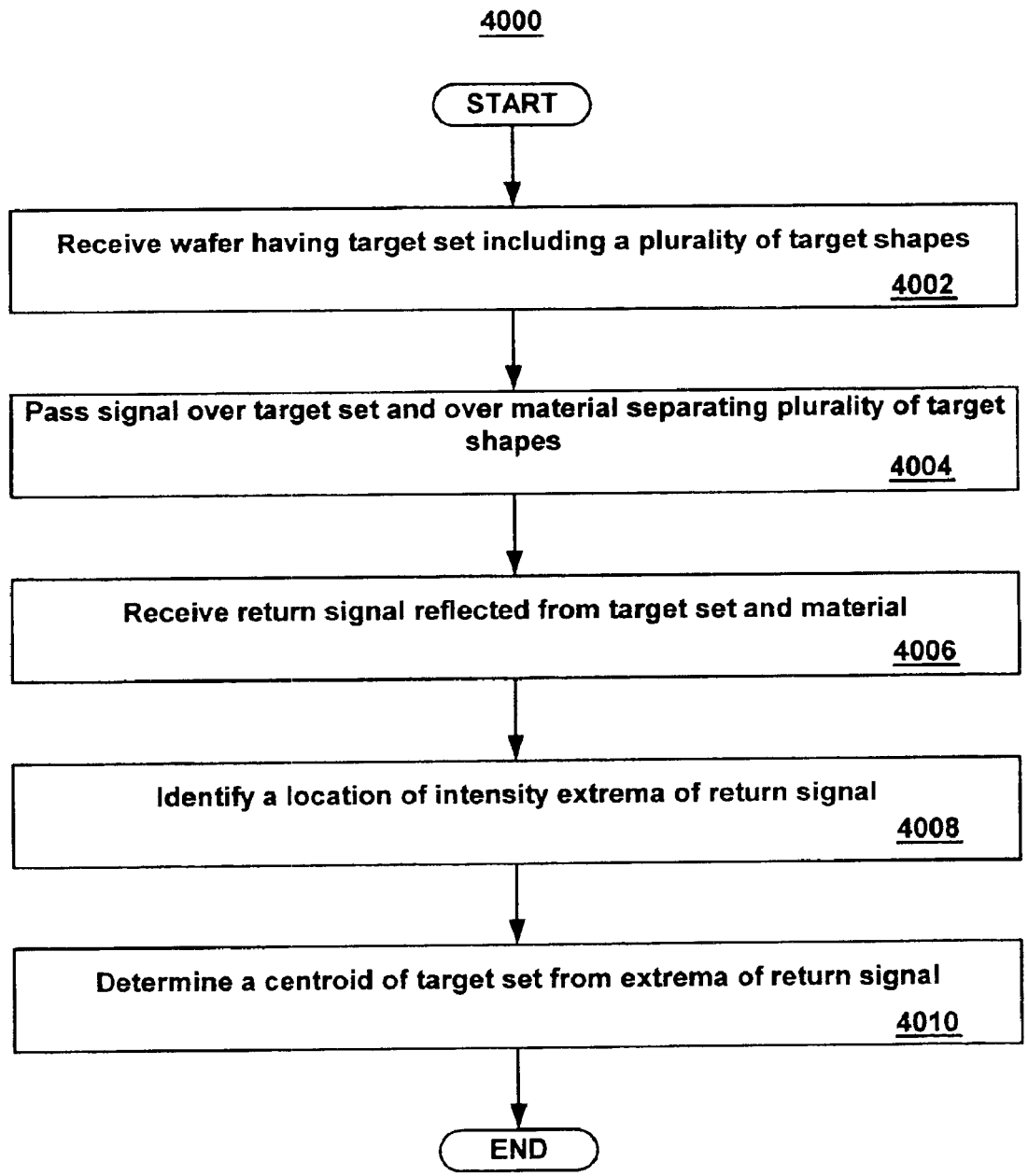
FIG. 4 is a flowchart of the steps performed to determine a centroid of a target in a wafer, in accordance with one embodiment of the present invention.

Referring now to FIG. 4, a flowchart 4000 of the steps performed to determine a centroid of a target set in a wafer is shown, in accordance with one embodiment of the present invention. By using the embodiment of flowchart 4000, the present invention provides a method that more accurately determines the centroid of the targets having adverse flatness and symmetry conditions. While the present invention utilizes flowchart 4000 for determining the centroid of targets on a wafer in a stepper, the present invention is well-suited to finding centers, averages, or centroids of targets or of some product patterns, on a wafer, a layer of a wafer, or another article as held by a stepper, a calibration machine, or some other device.

Flowchart 4000 begins with step 4002. In step 4002 of the present embodiment, a wafer is received. In one embodiment, the wafer already has a plurality of target shapes formed therein. Step 4002 is implemented, in one embodiment, with wafer 300 of FIGS. 3A and 3B, that has targets 304a–304d formed therein. Step 4002 is also shown in FIG. 2 where wafer 206 is received in stepper 202.

Step 4002 is well-suited to alternative embodiments. For example, the present invention is well-suited to having any number of targets of any size, shape, or configuration that are oriented in any direction. In another embodiment, the number of target shapes must be at least two so as to provide at least one "land" of material between the two targets. In an alternative embodiment, only one target can be used, so long as some other feature nearby the target provides a "land" of material that can have an extrema, e.g. a maxima point. In one embodiment, the land of material can be any material so long as it provides a return signal that can be distinguished from a return signal from the target. As shown in FIG. 3B, other layers of material usually cover the target. For example, layer 308 of metal covers targets 304a–304d. Above layer 308 is layer 316 of photoresist material. The combination of photoresist material 316 and metal layer 308 of the present embodiment allow the creation of metal patterns in layer 308. That is, a pattern for IC lines can be formed on photoresist layer 316, from a pattern on a mask, and subsequently etched in metal layer 308. Accurate identification of the location of targets, e.g. targets 304a–304d, afforded by the present invention allows accurate formation of patterns in subsequent layers. Following step 4002, flowchart 4000 proceeds to step 4004.

In step 4004 of the present embodiment, a signal is passed over the target set and over the material separating the plurality of target shapes. FIG. 2 shows one embodiment of the present step 4004. In FIG. 2, signal transceiver 204 is adapted to provide a signal passed across wafer 206. Well-known methods and apparatus can provide a wide range of signal properties, e.g. signal direction, intensity, and control, for step 4004. In one embodiment, the signal is passed over a target set and material land between target shapes in a single pass. Step 4004 can be implemented, in one embodiment, on wafer 300. In this embodiment, a signal is passed over targets 304a–304d and the lands of material separating each target shape. The signal is an electromagnetic signal in one embodiment. More specifically, the signal is a laser signal generated from any one of many well-known lasers utilized for target acquisition. FIG. 3B shows one embodiment implementing step 4004. In FIG. 3B, signal 301a is transmitted onto concave surface, of layer 308, formed in response to concave surface of target 304a.

Step 4004 is well-suited to alternative embodiments. For example, signal transceiver 204 includes the alternative configurations provided for FIG. 2. Furthermore, the signal can be passed over a single target set, shown in FIGS. 3A and 3B. Besides using a laser signal, the present invention is well-suited to alternative signal types, such as an electron beam signal. Following step 4004, flowchart 4000 proceeds to step 4006.

In step 4006 of the present embodiment, a return signal is received. FIG. 2 shows one embodiment of the present step 4006. In FIG. 2, a return signal is received by signal transceiver 204 from wafer 206. Step 4006 is also implemented by the embodiment as shown in FIG. 3A and 3B. In FIG. 3B, signal 301*a* is not received by detector 302 because the surface of layer 308 causes signal 301*a* to reflect at an angle, thus missing the detector 302. This low amplitude return signal is shown by a low intensity value 325 on the left wide of max 1 321 of FIG. 3C. In contrast, signal 301*b* is reflected with nearly zero angle of reflection from surface 305, because it is flat, and thus detector 302 receives a strong return signal. This high amplitude return signal is shown by a high intensity, e.g. max 3 323, in FIG. 3C. This step uses well-known methods and apparatus to receive the return signal.

The present invention is well-suited to alternatives from the embodiments described for step 4006. For example, the return signal can be received by a receiver device that is separate from the signal transmitter device. Additionally, while the present embodiment, shown in FIG. 2, has no magnification or interim modification of signal between signal transceiver 204 and wafer 206, the present invention is well-suited to some interim modification of signal. Furthermore, the present invention is well-suited to detecting target location under a layer of material other than the reflective metal layer 308 used in the present embodiment. In this alternative embodiment, the return signal 324 of FIG. 3A may have different minima or maxima responses due to the different reflective properties of the alternative material layer. Following step 4006, flowchart 4000 proceeds to step 4008.

In step 4008 of the present embodiment, an extrema of the return signal is identified. In the present embodiment, only the return signal generated from the land of material separating target shapes, as noted in step 4006, is analyzed for the extrema location. FIG. 3C shows one embodiment of the present step 4008 where maxima 1 321 and maxima 3 323 are maximum intensities for a return signal generated from lands of material between targets. Maxima 1 321 of FIG. 3C represents the maxima for virtual rectangle target 313*a*. Similarly, maxima 2 322 of FIG. 3C represents the maxima for virtual rectangle target 313*b*. The maximum intensity can be determined for a return signal from all lands that provide a return signal. The present embodiment utilizes a maxima point of a return signal for identifying the maximum intensity of return signal, as discussed in FIG. 3C.

Step 4008 can be implemented by programming a stepper, in one embodiment, the present embodiment would program the stepper to recognize the two virtual rectangles. Thus, the present embodiment would program the stepper to recognize only 2 rectangles, e.g. virtual rectangles 313*a* and 313*b* of FIG. 3A, having a width of approximately 28 $\mu$each, e.g. width 305 of FIG. 3A, and spaced apart by approximately 20$\mu$, e.g. land 315. In contrast, the conventional method would program the stepper to recognize 4 rectangles having a width of approximately 2–4$\mu$ each, and a spacing of approximately 20$\mu$. However, given the noisy signal arising from contamination in the layers formed over each individual target, the accuracy of the location of the target, which may not even be acquirable, would be very poor. Consequently, the present invention, by using virtual targets formed from individual targets, greatly increases target acquisition rate and centroid accuracy.

Step 4008 is well-suited to alternative embodiments. For example, while two maxima are used in step 4008, resulting from lands between four targets, the present invention is well-suited to having only two targets that create only one maxima point from the material in between. This embodiment can be implemented in FIG. 3A by having only targets 304*a* and 304*b* provide a maxima 1 321 of FIG. 3C. Furthermore, the maximum intensity of a return signal can be determined by sampling and comparison of maximum discrete values, in lieu of a maxima determined by slope. While the present invention utilizes a maximum intensity of a return signal for determining a centroid between targets, the present invention is well-suited to using an alternative extrema. For example, if the land of material separating targets is more signal-absorbing, rather than more signal-reflective, than the targets, then the present invention could utilize a minimum intensity point as the centroid of the land, or as the centroid of the target set. Following step 4008, flowchart 4000 proceeds to step 4010.

In step 4010 of the present embodiment, a centroid for target sets is determined from the extrema of the return signal. In the present embodiment, three target sets are used on a wafer. Thus, the centroid is determined from the average value of the two extrema, e.g. maximum intensity points, of the return signal from the two outer material lands separating the target shapes in each target set. FIG. 3C shows one embodiment of the present step 4010. In FIG. 3C, centroid 309*c* of the target set is determined by the average of locations of maxima 1 321, shown as centroid A 309*a*, and of maxima 3 323, shown as centroid B 309*b*. The centroid calculation can be appropriately offset from a standard measuring reference, or from each other. Centroid 309*c* is provided in the X-direction only for the present embodiment. Location of centroid 309*c* can be calculated using a centroid calculation, e.g. equation 1.1, or using an averaging equation, e.g. equation 1.2.

$$\text{Centroid} = [\Sigma(\text{location Maxima } n)]/m \qquad (\text{Eq. 1.1})$$

where: n=1, m; m=quantity of extrema $$\text{Centroid} = [(\text{Maxima 1} + \text{Maxima 3})]/2 \qquad (\text{Eq. 1.2})$$

Step 4010 is well-suited to alternative embodiments. For example, in lieu of simple averaging, the present invention is well-suited to weighting the locations of different extrema intensity points, depending upon their location, accuracy, or signal response characteristics. Additionally, the present invention can utilize interim centroids in lieu of maximum intensity points for determining centroid of multiple target steps. However, this alternative embodiment provides a different method, with associated benefits of alternative weighting techniques to determine the ultimate composite centroid. Additionally, targets can be oriented in an alternative direction to provide a centroid in the alternative direction.

As an alternative embodiment to step 4010 maxima 3, not used for determining overall centroid 309*c* in the present embodiment, can be utilized. Similarly, the maxima and centroids may be programmed differently. For example, even though all maxima shown in FIG. 3C may be detected by detector 302 of FIG. 3B, one embodiment of the present invention may be tailored to only detect one of them. For example, the stepper can be programmed to see signal 334a of FIG. 3C arising from target 304a of FIG. 3B as one side of an even larger virtual rectangle, not shown. Similarly, the stepper can be programmed to see signal 334d of FIG. 3C arising from target 304d of FIG. 3B as the other side of the even larger virtual rectangle. Consequently, it would identify maxima 2 322 of FIG. 3C as the centroid of the even larger virtual rectangle. The stepper could be programmed to regard maxima 1 321 and maxima 3 323 as noise, and thus ignored.

Many of the instructions for the steps, and the data input and output from the steps, of flowcharts 4000 utilize memory and utilize controller hardware shown in FIG. 2. For example, wafer 206, stage 208, and signal transceiver 204, can be controlled by memory 214 and processor 212 to accomplish the requirements steps in flowchart 4000. The alternative embodiments of FIG. 2 are equally applicable to implementing the steps of flowchart 4000. In one embodiment, software in memory 214 does not need to be modified for the new process. Instead, the software can be fooled into measuring the desired maxima points by having a user input a number of targets that misrepresents the actual number of targets, but beneficially produces the desired results of flowchart 4000.

While flowchart 4000 of the present embodiment shows a specific sequence and quantity of steps, the present invention is suitable to alternative embodiments. For example, not all the steps provided for flowchart 4000 are required for the present invention. Furthermore, the present invention is well-suited to an embodiment which includes additional steps to flowchart 4000. Likewise, the sequence of the steps can be modified depending upon the application. Furthermore, while flowchart 400 is shown as a single serial process, it can also be implemented as a continuous or parallel process. Many of the instructions for the steps, and the data input and output from the steps, of flowchart 4000 utilize memory and controller hardware shown in FIG. 2.

Figure 5A:
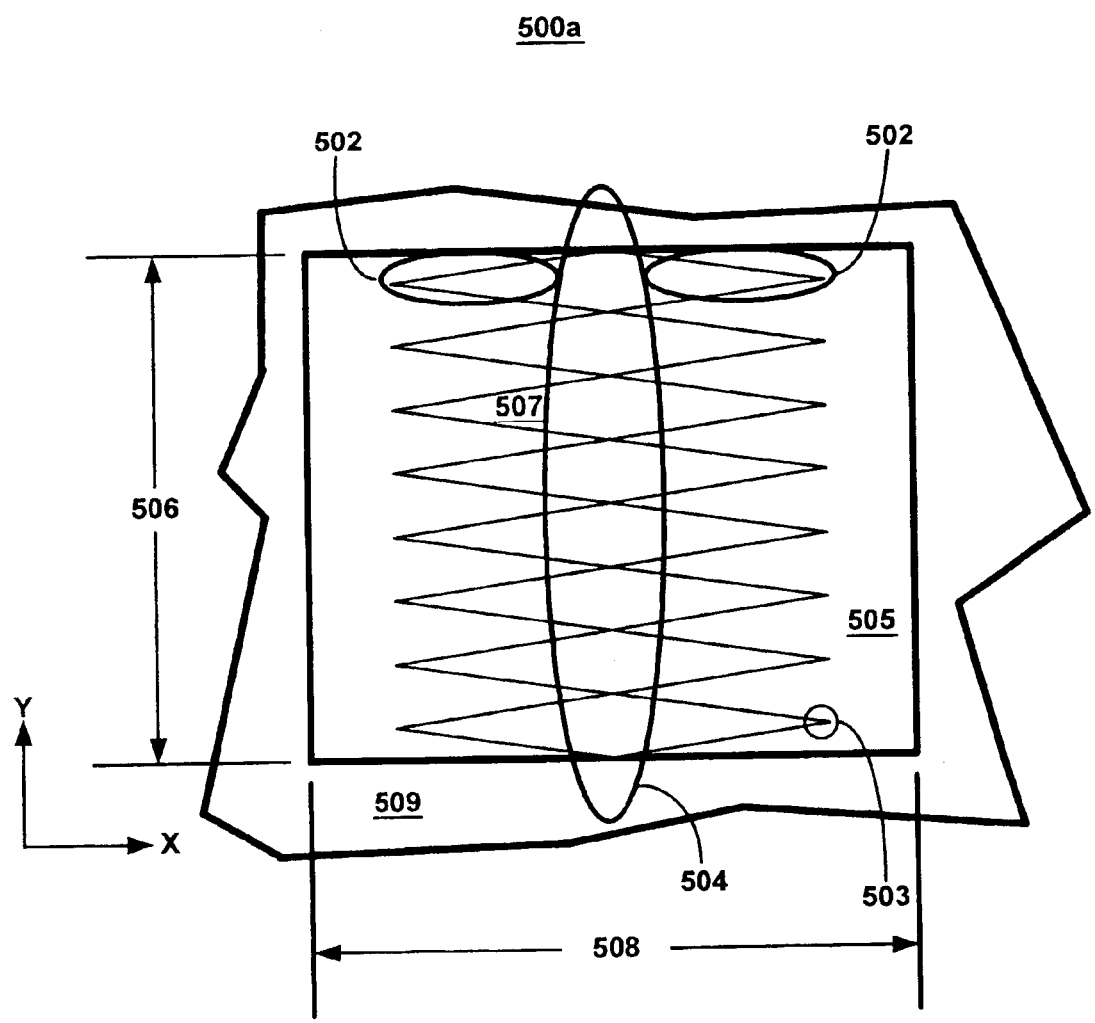
FIG. 5A is a first configuration of a target pattern that is highly tolerant to asymmetry and non-flatness, in accordance with one embodiment of the present invention.

Referring now to FIG. 5A, a first configuration of a target pattern 507 of mask 500a that is highly tolerant to asymmetry and non-flatness is shown, in accordance with one embodiment of the present invention. FIG. 5A shows a sawtooth target pattern, symmetric about an axis in the Y-direction. Target pattern 507 is shown as a target pattern on a mask, or reticle. However, the reticle 500a can be used to form this same pattern, or its negative, on a wafer. Sawtooth pattern 500a has multiple fingers, e.g. such as exemplary fingers 502, coupled to a spine 504. Spine 504 extends lengthwise in the Y-direction, while fingers, such as fingers 502 on both sides of spine 504 extend lengthwise in a perpendicular direction to spine 504, e.g. extend in the X-direction. By having a sawtooth edge, e.g. 502, on either side of spine 504, the present invention provides a target shape that is not sensitive to the edge conditions of the target. Background 509 of mask 500a surrounds target pattern 500a. That is, only the small area of tip, e.g. 503, of target shape 507 will be subject to the edge irregularities of asymmetry and non-flatness arising with conventional CMP methods and apparatus.

Alignment target 500a of FIG. 5A has a width 508 of 20μ and a height 506 of 30μ in one embodiment. However, the present invention is well-suited to a wide range of heights and widths of alignment target. In one embodiment, the dark pattern of target 507 is a chrome material on a mask, or a reticle. In the present embodiment, background 505 is transparent. In this configuration, light shines through background 505 to create a pattern that will subsequently form a trench in a layer of material on a wafer. However, the present invention is well-suited to alternative materials, use of gray scale shades for target and background, and to using a negative of the pattern. In another embodiment, pattern 500c is a target pattern existing in a layer of material in a wafer.

By using the present invention, such as the embodiment of FIG. 5A, a more accurate target location can be obtained using the spine and finger configuration target shape in lieu of a conventional rectangular target shape. While the sawtooth fingers 502 of the present embodiment may increase noise in the return signal, the return signal from spine 504 of target pattern 500a should rise above the noise to provide a sharp distinctive extrema for the intensity return signal as shown in FIG. 5C. Additionally, while the spine and fingers of FIG. 5A are shown with a particular shape, quantity, configuration, and orientation, the present invention is well-suited to many different configurations, orientations, shapes, and quantities of target pattern that are highly tolerant to, or immune from, asymmetry and non-flatness of surface arising from conventional CMP process and materials.

Figure 5B:
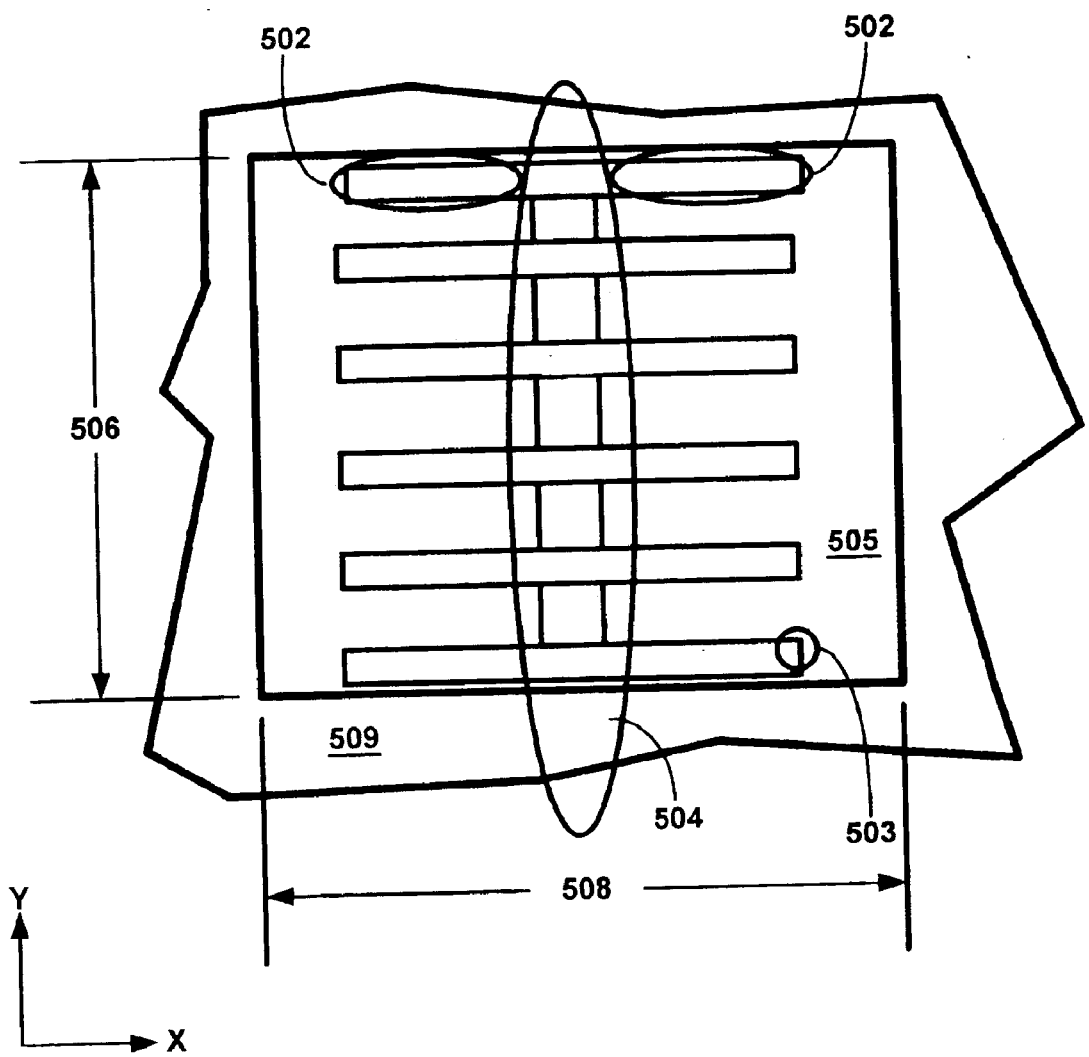
FIG. 5B is a second configuration of a target pattern that is highly tolerant to asymmetry and non-flatness, in accordance with one embodiment of the present invention.
Figure 5C:
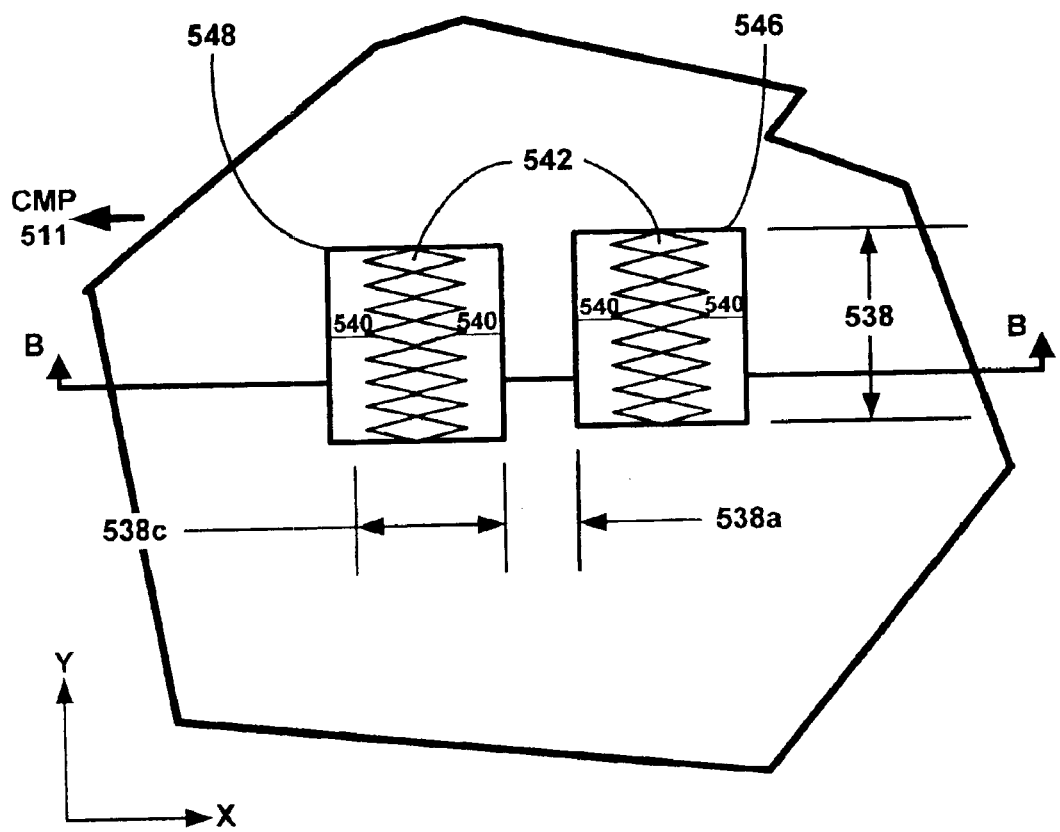
FIG. 5C is a wafer with a target having asymmetry and flatness immunity, in accordance with one embodiment of the present invention.

Referring now to FIG. 5B, a second configuration of a target pattern 507 on mask 500b that is highly tolerant to asymmetry and non-flatness is shown, in accordance with one embodiment of the present invention. FIG. 5B shows a rectangular-tooth pattern, symmetric about an axis in the Y-direction. Target pattern 500b can exist as a pattern on a mask, or reticle, or as a pattern formed on a silicon wafer from the mask. FIG. 5B includes a rectangular spine 504 extending in the Y-direction. Fingers 502 extend perpendicular from spine 504, e.g. extend in the X-direction. Instead of the sawtooth shape shown in FIG. 5A embodiment, the FIG. 5B embodiment has fingers with a rectangular shape. Background 509 of mask 500b surrounds target pattern 507. The same benefits and alternative available to the embodiment of FIG. 5A apply to FIG. 5B.

Referring now to FIG. 5C, a wafer 500c with a target having asymmetry and flatness immunity is shown, in accordance with one embodiment of the present invention. Wafer 500c has a first target shape 546 and a second target shape 548. First target shape 546 is spaced a distance 538a away from second target shape 548. The target shapes provide a centroid in the X-direction. In one embodiment, first and second target shapes 546 and 548 are essentially a negative image of a target pattern similar to the target pattern 507 shown in FIG. 5A. In one embodiment, height 538b of target is 40 microns ($\mu$), width 538c of target pattern is 24$\mu$, and distance 538a between multiple targets is 16$\mu$. However, the present invention is well-suited to a wide range of dimensions for a target, and a wide range of distances separating multiple targets. While the present embodiment shows target shapes having a specific geometry, orientation, and quantity, the present invention is well-suited to many alternative geometries, orientations, and quantities of target shapes.

Referring now to FIG. 5D, the wafer 500c of FIG. 5C is shown, in accordance with one embodiment of the present invention. Specifically, FIG. 5D shows wafer 500c in a cross-sectional view, e.g. View B—B. Similar to FIG. 3B, FIG. 5D includes a first layer 566 located above a substrate 564 of wafer 500c. In layer 566, a pattern similar to patter 500a of FIG. 5A is etched to provide trenches that are filled with metal, e.g. metal 560 in trench. Lands of the original layer of material 566 exist between filled trenches 560. These lands are shown as items 561, 562, and 563. Above the lands exists a layer of material 567, such as metal, that somewhat conforms to the surface of trenches 560 and of layer 566. On top of layer 567 is a layer of photoresist 568, upon which an image will be patterned.

Dashed lines 569 above trenches 560 represents how sawtooth pattern 542 shown in FIG. 5C provides a varying trench depending whether View B—B is taken at the peak-to-peak portion of the sawtooth pattern 540 or from the root-to-root portion of the sawtooth 540. The effect from the sawtooth pattern is repeated in subsequent layer 567 where dashed lines 572 represent how layer 567 fills in the sawtooth pattern existing in trenches 560 of the underlying layer. Similarly, land 571 in layer 567 is proximately adjacent and conformal to top surface of land, e.g. top surface 561 of land 566, in the underlying layer.

Figure 5E:
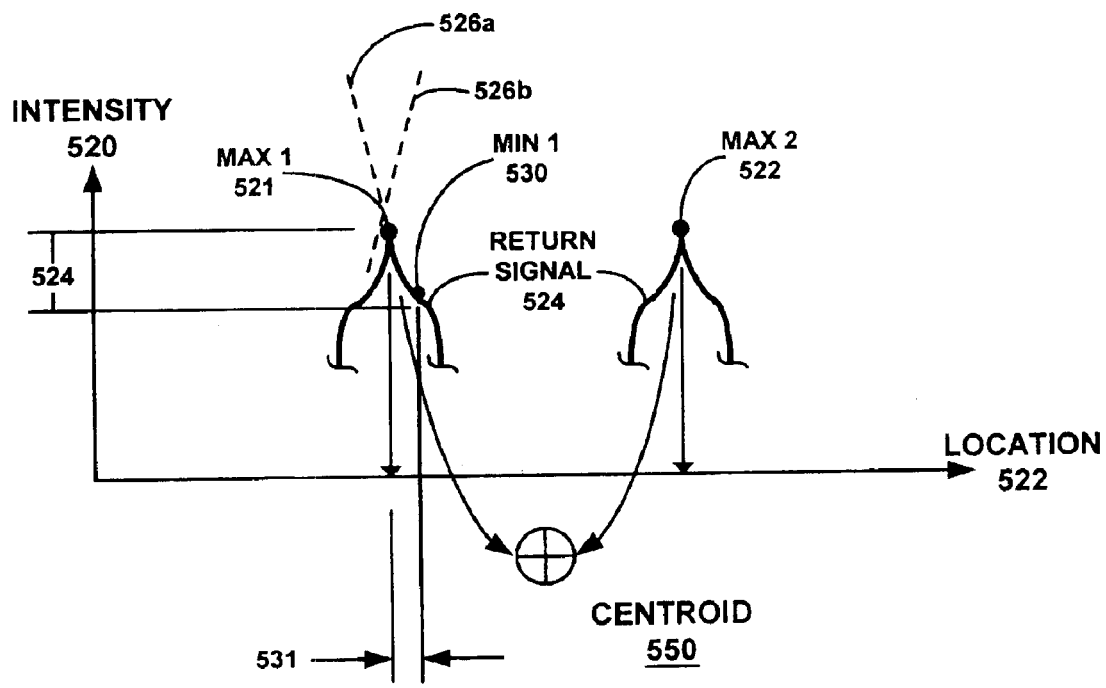
FIG. 5E is a graph showing a return signal from a wafer target having a pattern such as the one shown in FIG. 5C, in accordance with one embodiment of the present invention.

Referring now to FIG. 5E, a graph 500e of a return signal from a wafer target that is highly tolerant to asymmetry and non-flatness is shown, in accordance with one embodiment of the present invention. Graph 500e of FIG. 5E has an ordinate axis of intensity 520 and an abscissa axis of location 522. Return signal 521 shown is FIG. 5E represent the portion of return signal 524, shown in FIG. 5D, that is reflected from a material area of wafer separating targets, e.g. lands 566. Thus, maxima 1 521 in FIG. 5E is signal 521 in FIG. 5D reflected from flat land 571 of layer 568 that effectively indicates the land of material separating targets in the underlying layer. In contrast, return signal 530 of FIG. 5D does not show as return signal 524 of FIG. 5E because the angle of reflection significantly reduces the intensity of the return signal to detector 302a.

In one embodiment, improved target pattern 507 of FIG. 5A can be substituted for target 304a–304d of FIG. 3A. Return signal 524 of FIG. 5E has an impulse-like response corresponding to the spine, e.g. spine 504 of FIG. 5A or spine 542 of FIG. 5C. That is, the extrema, e.g. maximum 1 521 and maximum 522, of graph 500e of FIG. 5E are much more pronounced than the extrema, e.g. maximum 1 321, maximum 2 322, and maximum 3 323, of a return signal, e.g. 324, from a target without the improved edge configuration as shown in FIGS. 3A–3C. Thus, the change in slope from a negative slope 526a to a positive slope 526b for return signal 524 from the improved target configuration occurs over a smaller distance, e.g. over a very small span, e.g. span 531, to obtain the extrema, in one embodiment of the present invention. Hence, the present invention significantly narrows the range of error in comparison to conventional methods and apparatus. Additionally, the ratio of maximum signal to a minimum signal is much higher for the present invention than for the prior art. FIG. 5E shows one embodiment of this higher maximum to minimum signal ratio as the maximum MAX 1 521 divided by MIN 1 530, and as shown by span 531 between maximum 1 521 and minimum 530. This higher ratio translates into an improved target from which a more accurate target centroid can be determined.

The application of graph 500e, and the alternatives available for the data of graph 500e are similar to those presented for graph 300c of FIG. 3C. Similarly, Flowchart 4000 is also applicable to the target designs of FIGS. 5A and 5B.

In summary, the present invention provides an apparatus and a method that ensures accurate formation of patterns on adjacent layers of the wafer by providing accurate target location. Additionally, the present invention provides an apparatus and a method that will accurately locate a target on a wafer regardless of the flatness of the target surface. Furthermore, the present invention provides an apparatus and a method that will accurately locate the target on a wafer regardless of the asymmetry of the target surface. The proposed apparatus and method has an increased target acquisition rate, using either a conventional or a modified target. Finally, the present invention provides a target design immune from the asymmetry and non-flat surfaces likely to arise in conventional CMP processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the claims appended hereto and their equivalents.

We claim:

1. A method of determining a centroid of a target set in a wafer, said method comprising the steps of:
   a) receiving said wafer, said wafer having said target set formed therein, said target set including a plurality of target shapes separated by a material;
   b) passing a signal over said plurality of target shapes and over said material of said target set;
   c) receiving a return signal that is reflected from said plurality of target shapes and from said material separating said plurality of target shapes within said target set;
   d) identifying a location of each of at least one extrema of said return signal reflected from said material separating said plurality of target shapes within said target set; and
   e) determining said centroid of said target set from said at least one extrema of said return signal.

2. The method recited in claim 1 wherein said at least one extrema is a maxima point.

3. The method recited in claim 2 wherein said maxima point is determined from a slope of an intensity of said return signal, said slope existing on either side of said maxima point.

4. The method recited in claim 1 wherein said signal is a laser signal.

5. The method recited in claim 1 wherein said plurality of target shapes includes two rectangular target shapes.

6. The method recited in claim 1 wherein said plurality of target shapes includes four rectangular target shapes.

7. A method of determining a centroid of a target set in a wafer, said method comprising the steps of:
   receiving said wafer, said wafer having said target set formed therein, said target set including a plurality of target shapes separated by a material wherein said plurality of target shapes includes two rectangular target shapes;
   passing a signal over said plurality of target shapes and over said material of said target set;
   receiving a return signal that is reflected from said plurality of target shapes and from said material separating said plurality of target shapes within said target set;
   identifying a location of each of at least one extrema of said return signal reflected from said material separating said plurality of target shapes within said target set wherein only one maxima point is generated; and
   determining said centroid of said target set from said at least one extrema of said return signal.

8. The method recited in claim 7 wherein said centroid is located at said one maxima point.

9. A method of determining a centroid of a target set in a wafer, said method comprising the steps of:
   receiving said wafer, said wafer having said target set formed therein, said target set including a plurality of target shapes separated by a material wherein said plurality of target shapes includes four rectangular target shapes;

passing a signal over said plurality of target shapes and over said material of said target set;

receiving a return signal that is reflected from said plurality of target shapes and from said material separating said plurality of target shapes within said target set;

identifying a location of each of at least one extrema of said return signal reflected from said material separating said plurality of target shapes within said target set wherein said at least one extrema are comprised of three maxima points, said three maxima points including two outer maxima points and a center maxima point; and determining said centroid of said target set from said at least one extrema of said return signal.

10. The method recited in claim 9 wherein a location of said centroid is based on a median location between said two outer maxima points, averaged with a location of said center maxima point.

11. The method recited in claim 9 wherein a location of said centroid is based on a centroid calculation using a location of all three maxima points.

12. A stepper for aligning a wafer, said stepper comprising:

a processor; and a computer readable memory, said computer readable memory coupled to said processor, said computer readable memory containing program instructions stored therein that when executed by said processor implement a method for determining a centroid of a target set in said wafer, said method comprising the steps of:

a) receiving said wafer, said wafer having said target set formed therein, said target set including a plurality of target shapes separated by a material;

b) passing a signal over said plurality of target shapes and over said material of said target set;

c) receiving a return signal that is reflected from said plurality of target shapes and from said material separating said plurality of target shapes within said target set;

d) identifying a location of each of at least one extrema of said return signal from said material separating said plurality of target shapes within said target set; and e) determining said centroid of said target set from said at least one extrema of said return signal.

13. The stepper as recited in claim 12, wherein said signal is a laser light sigal.

14. The stepper as recited in claim 12, wherein said extrema is a maxima point determined from a slope of an intensity of said return signal, said slope existing on either side of said maxima point.

* * * * *